United States Patent [19]

Valet et al.

[11] Patent Number: 5,463,516
[45] Date of Patent: Oct. 31, 1995

[54] MAGNETORESISTIVE TRANSDUCER OR MAGNETIC READ HEAD INCLUDING A LAYER OF COMPOSITE MATERIAL INCLUDING CONDUCTING MAGNETIC PARTICLES IN AN INSULATING MATERIAL

[75] Inventors: Thierry Valet, Viroflay; Stéphane Tyc, Paris, both of France

[73] Assignee: Thomson-Csf, Puteaux, France

[21] Appl. No.: 79,938

[22] Filed: Jun. 23, 1993

[30] Foreign Application Priority Data

Jun. 23, 1992 [FR] France .................... 92 07626

[51] Int. Cl.⁶ ...................... G11B 5/39
[52] U.S. Cl. ...................... 360/113
[58] Field of Search ............ 360/113; 338/32 R; 324/252

[56] References Cited

U.S. PATENT DOCUMENTS

| | | | |
|---|---|---|---|
| 3,840,898 | 10/1974 | Basorek et al. | 360/113 |
| 5,043,693 | 8/1991 | Edelstein | 338/32 R |
| 5,216,560 | 6/1993 | Brug et al. | 360/113 |

FOREIGN PATENT DOCUMENTS 0216062 4/1987 European Pat. Off. .
0301902 2/1989 European Pat. Off. .

OTHER PUBLICATIONS

C. Denis Mee & Eric D. Daniel, Magnetic Recording Handbook, 1988, pp. 303–309.
IBM Technical Disclosure, "Magnetic–Fiero Tunnel–Sensor", vol. 19, No. 6 Nov. 1976.
Solid State Communications, vol. 9, 1971, pp. 1197–1200, Y. Goldstein, et al., "Ferromagnetism in Granular Nickel Films".
Patent Abstracts of Japan, vol. 014, No. 194 (E–919), Apr. 20, JP-A-20 40 972, Feb. 9, 1990.
Patent Abstracts of Japan, vol. 011, No. 081 (E–488), Mar. 12, 1987, JP-A-61 234 083, Oct. 18, 1986.
IBM Technical Disclosure Bulletin, vol. 7, No. 6, Nov. 1964, p. 427, J. C. Suits, "High Magnetic Field Measuring Devices".

Primary Examiner—Stuart S. Levy
Assistant Examiner—David D. Davis
Attorney, Agent, or Firm—Oblon, Spivak, McClelland, Maier & Neustadt

[57] ABSTRACT

A transducer contains at least one layer of a composite material containing particles of a conducting magnetic material in a non-magnetic and insulating or semiconductor matrix material and two electrodes deposited on at least one face of the layer for measuring resistance of the layer.

7 Claims, 5 Drawing Sheets

MAGNETORESISTIVE TRANSDUCER OR MAGNETIC READ HEAD INCLUDING A LAYER OF COMPOSITE MATERIAL INCLUDING CONDUCTING MAGNETIC PARTICLES IN AN INSULATING MATERIAL

BACKGROUND OF THE INVENTION

1. Field of the Invention

This invention concerns a magnetoresistive transducer and particularly a magnetoresistive transducer made of thin layers usable to detect magnetic fields.

2. Description of the Preferred Embodiments

In the various fields of application of thin layer magnetoresistive materials (read heads for magnetic recordings, magnetometers, compasses, various types of detectors), all components are now made with thin layers of magnetic alloys such as "Permalloy": $Ni_{80}Fe_{20}$.

The physical phenomenon used is anisotropic magnetoresistance which results in a resistivity expressed as follows:

$$\rho = \rho_0(1 + \delta \cos^2\theta) \quad (1)$$

where $\theta$ is the angle between the magnetization and the current in the material, and $\delta$ is the relative variation of resistivity between the two extreme situations: magnetization parallel to or perpendicular to the current (typically $\delta = 0.01$). The term $\rho_0$ is a constant.

These types of thin layers have a number of disadvantages that restrict component performances, for example:

—resistivity is a function of the magnetization orientation, and is related to the value to be measured (the amplitude and/or orientation of an external magnetic field) by a frequently complex behavioral law (non-linear) or even by non-unique values (hysteresis).

—the presence of noise intrinsically related to the discontinuous and non-deterministic nature of the magnetization process of a ferromagnetic: Barkausen noise.

—the fact that the magnetic field orientation reference is relative to the current, which is an implementation constraint.

—temperature highly dependent on the average resistivity and the magnetoresistance $\delta$ (typically 1000 ppm/° C.) of this type of alloy close to the ambient temperature.

—a low average resistivity of the order of a few tens of $\mu\Omega.cm$ implying complex transducer geometries (coils) in order to achieve resistance values that are easy to measure. Moreover, this excludes the construction of detectors in which the current circulates perpendicular to the plane of the thin layer. This possibility may be very interesting from the integration point of view, particularly in the magnetic recording field as described in French Patent request number 90 09301.

Devices are also known using metallic magnetic multilayers with larger effects where $\delta = 0.1$ (at ambient temperature and for the same values of the saturation field)—independently of the relative orientation of current magnetization, but without correcting the other weaknesses mentioned. In particular, concerning the variation with temperature and the low value of the average resistivity.

It has also been observed that the conductance of a metal/insulation metal tunnel junction in which two electrodes consist of itinerant ferromagnetics, where itinerant means that electrons carrying magnetic movement participate in electrical conduction (typically 3d magnetic metals and their alloys) depends on the relative orientation of magnetization vectors on each side of the barrier. More precisely, if $\theta$ is the angle between these two vectors and d is the barrier width, the conductance is:

$$G = G_0\theta + \frac{d}{\lambda}\left(1 + \Delta\cos^2\left(\frac{\theta}{2}\right)\right) \quad (2)$$

where $\lambda$ is tunnel length that depends on the material, typically between 1 and 100 nanometers, and $\Delta$ is a modulation amplitude between 0 and 1. The term $G_0$ is a constant.

The document T. MIYAZAKI et al. J.M.M.M. 98, L7 (1991) contains a list of values of $\Delta$ observed to date, from which a maximum effect $\Delta = 0.14$ is deduced at ambient temperature for an $Ni_{82}Fe_{18}/Al_2O_3/Co$ junction.

It is also well established that co-evaporation or co-atomization methods can be used to make thin layers consisting of a dispersion of fine magnetic metallic particles in various insulating matrices ($Al_2O_3$, $SiO_2$, BN . . .). For metal phase fractions by volume of less than 50%, in the case in which metal and insulating phases cannot be mixed, and if these materials are deposited on an unheated substrate, quasi-spherical particles are generally obtained with a diameter of a few tens of Angstroms completely insulated from each other by the insulating matrix that may be amorphous ($SiO_2$, $Al_2O_3$) or crystallized (BN). Under these conditions, and as demonstrated experimentally for the $Ni/SiO_2$ system in the document written by J. I. GITTLEMAN et al, Phys. Rev. B5 (9), 3609 (1972), the system may simultaneously have a superparamagnetic behavior and electrical conductivity in low field dominated by the tunnel effect between particles.

The superparamagnetism concept refers to the fact that each magnetic particle behaves like a classical magnetic moment of value $VM_S$ (where V is the volume of the particle and $M_S$ is the magnetization of the constituent magnetic material), in which the orientation fluctuates thermally with a characteristic time:

$$\tau = \tau_0 e_k\left(\frac{-E_b}{kT}\right) \quad (3)$$

where $\tau_0$ is a constant that varies little with the material and is of the order of $10^{-10}$ s, and $E_b$ is an activation energy related to the various magnetic particle anisotropies. The term $e_k$ is a constant. For a particle with uniaxial anisotropy:

$$E_0 = KuV \quad (4)$$

where Ku is the anisotropic constant and V is the particle volume. Note that proportionality of Eb to the particle volume goes beyond the special case of activation energy associated with anisotropy.

SUMMARY OF THE INVENTION

The invention takes advantage of the properties of this type of thin composite layer to enable the manufacture of magnetic transducers.

Therefore the invention concerns a magnetoresistive transducer characterized in that it has at least one layer of composite material containing particles of magnetic material in a non magnetic and insulating or semiconductor material, and two deposited electrodes.

The various objectives and characteristics of the invention will become apparent more clearly in the following description and in the figures in the appendix which represent:

FIGS. 1a, 1b and 2, basic examples of the transducer according to the invention;

FIG. 3, an operation curve for the transducer in FIGS. 1 and 2;

FIGS. 4 and 5, transducers according to the invention equipped with methods of applying a continuous magnetic field;

FIG. 6, a device in which some particles are larger than others;

FIG. 7, a device with particles of different shapes;

FIG. 8, a device in which different types of particles are distributed by layers;

FIG. 9, an example construction of a magnetic head applying the transducer according to the invention;

DETAILED DESCRIPTION OF THE PREFERRED EMBODIMENTS

Figure 1A:
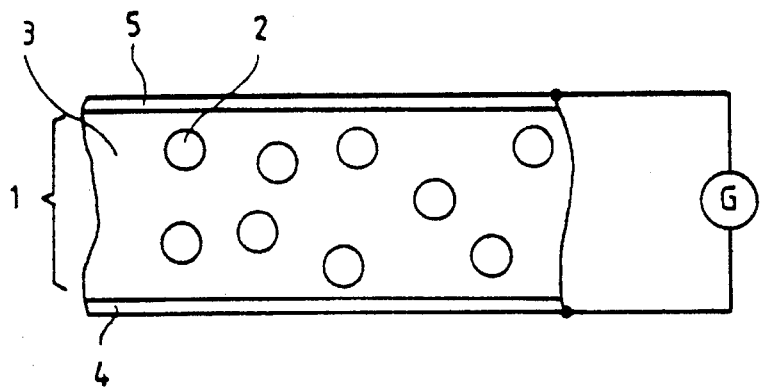

The basic device according to the invention in FIG. 1a contains a layer 1 of a composite material consisting of particles 2 of a magnetic material cast into an insulating or semiconductor material 3. This layer 1 is squeezed between two electrodes 4 and 5. A resistance measurement device is connected to electrodes 4 and 5.

Under the effect of an external magnetic field H to be detected, the magnetization orientation in particles 2 becomes aligned with the magnetic field H. The magnetization orientation in the various particles will therefore be uniform as shown in FIG. 1b.

More precisely, the assembly of particles forming a macroscopic element of the composite thin layer will then follow a Langevin's magnetization law under the effect of an external magnetic field. This perfectly reversible behavior (Langevin's law is ahysteretic) is observed when the applied magnetic field varies on a time scale that is large compared with τ, such that the temperature of the system can stabilize. If the tunnel conductance between particles follows the law (2), it is obvious that an external magnetic field will reduce the macroscopic resistivity of the material, due to the introduction of a global orientation of magnetic moments contrasting with the random and fluctuating configuration in a null field.

Under these conditions, the resistance measurement device G connected to electrodes 4 and 5 will be capable of detecting the resistivity variation of layer 1 and therefore of detecting the magnetic field H.

Figure 1B:
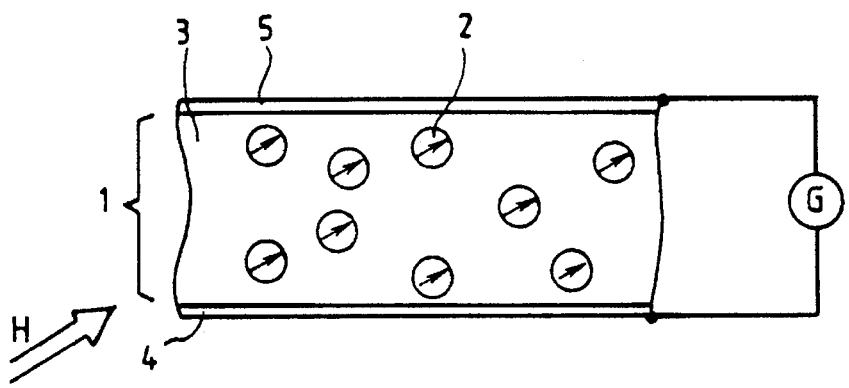

The device in FIGS. 1a and 1b has electrodes located on each side of layer 1 and used to measure the resistivity of layer 1 perpendicular to its plane.

Figure 2:
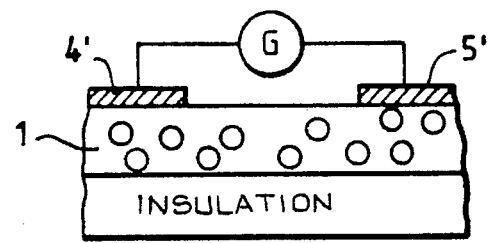

This is shown in FIG. 2, the two electrodes 4' and 5' may be located on the same side of layer 1. They are then used to measure the resistivity of the layer 1 perpendicular to its plane.

Figure 3:
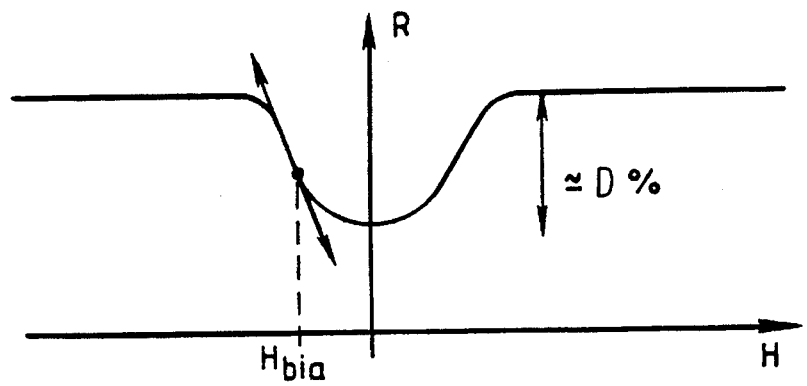

The resistivity variation of the layer 1 as a function of the magnetic field follows the variation law shown in FIG. 3. We will therefore plan to operate in an area with linear variations and providing a good detection sensitivity. This is done by applying a continuous magnetic field, for example $H_{bias}$ on FIG. 3, such that we can operate in a linear area on the curve. FIG. 3 shows the resistance versus magnetic field. The symbol D in FIG. 3 indicates a few percent of the total resistance change and FIG. 3 also shows a target line at a bias magnetic field $H_{bia}$.

Figure 4:
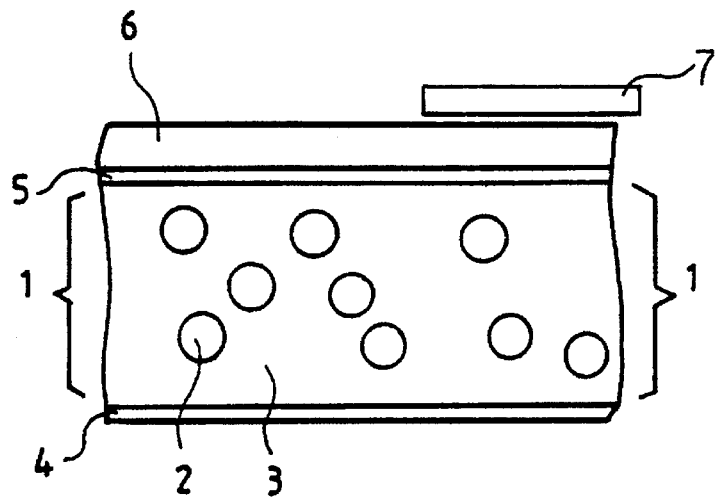
Figure 5:
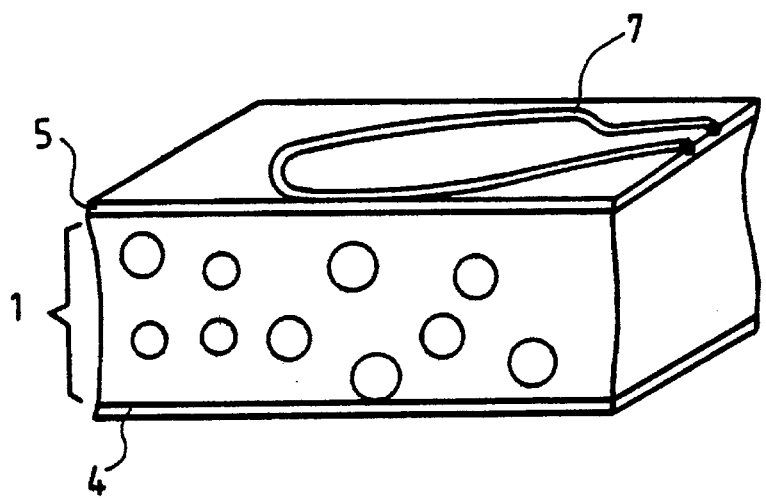

One method of applying this continuous magnetic field would be to use a permanent magnet such as a layer of magnetized material 6 shown on FIG. 4. This layer 6 may be a thin or thick layer depending on the induced magnetization intensity and the thickness of layer 1.

An electricity conducting loop 7 may also be provided to induce a magnetic field in layer 1. The conducting loop may be formed from magnetic material.

According to one construction alternative, a composite material is provided made of several particle types immersed in an insulating matrix. These particles may be uniformly distributed, or the density may vary at different points.

Particle types may be different due to the composition of the material from which they are made.

For example, we may choose at least one type of grain with "hard" magnetic behavior (in other words insensitive to the fields to be detected), and at least another type of grain with "soft" magnetic behavior, in other words such that their magnetization is easily aligned under the effect of the fields to be detected, and with a sufficiently low relaxation time with respect to the application. On average, one soft grain will only have hard neighbors and vice versa, such that soft/soft or hard/hard tunnel junctions cannot percolate through the material.

In this type of material, hard grains have their magnetizations aligned along a direction defined, for example, by prior saturation. This makes it possible to find relative resistivity modulation equal to Δ rather than Δ/2', and a resistance that is an uneven function of the applied field.

In the construction examples in FIGS. 1 to 5, magnetization of magnetic material grains are oriented at random when under a zero field. In the case shown in FIGS. 6 to 8, some grains are oriented. There is therefore a large difference in resistivity between the case in which an oriented field is applied along the same direction as the grain magnetization, and the case in which a field is applied oriented in the direction opposite to the grain magnetization.

Moreover, with magnetized grains we therefore have a response that is sensitive to the orientation of the magnetic field. But in this case the sensitivity is higher.

Particle types may also be different due to the different particle sizes. In particular, particles of two different sizes may be used. Since layer 1 is subject to an intense magnetic field, magnetization of the largest particles irreversibly aligns along this field. We must then consider that the size of the particles influences their response in a field in the sense that the relaxation time is exponentially dependent on the particle volume.

Figure 6:
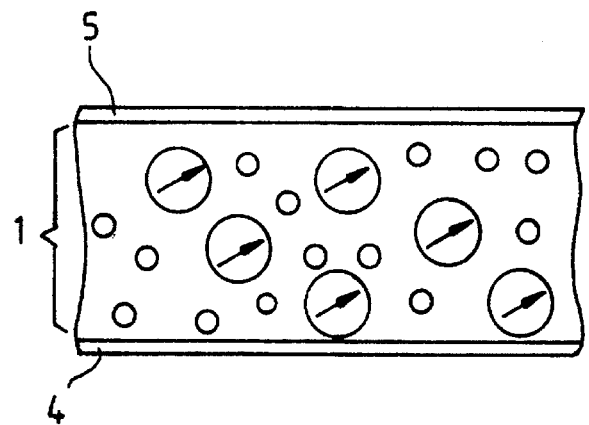

According to the invention, as shown on FIG. 6, large particles have their magnetization aligned along a defined direction; for example after application of a field that saturated them along this direction. This can give a relative resistivity modulation equal to Δ rather than Δ/2, and a resistance that is an uneven function of the applied field.

Figure 7:
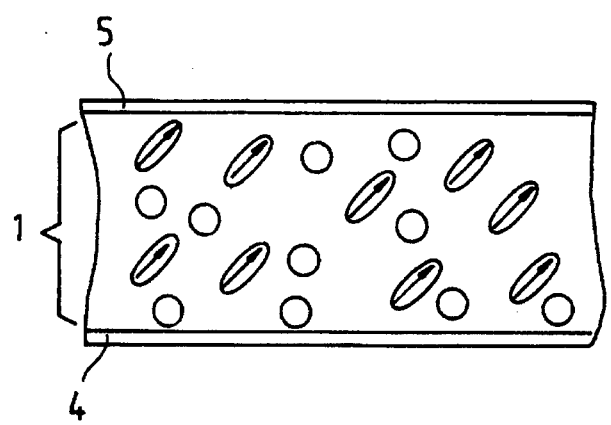
Figure 8:
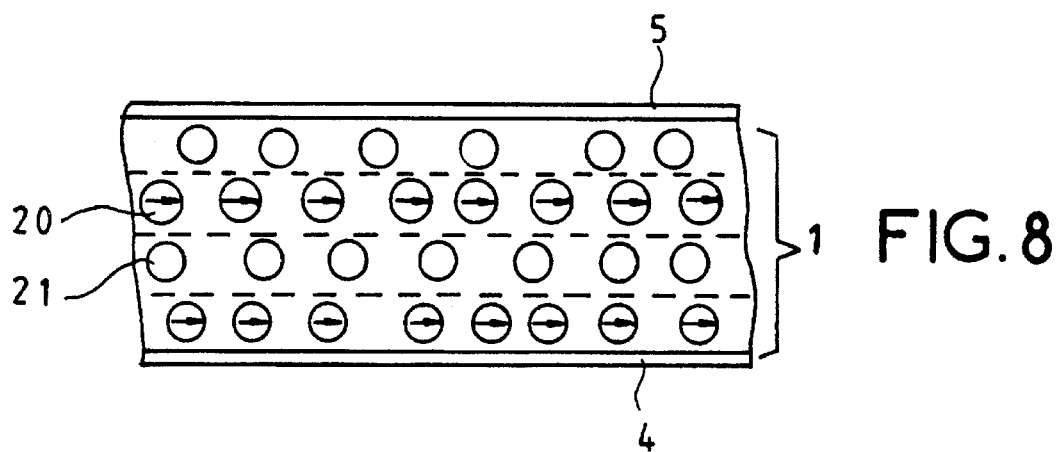

According to one construction alternative, particle types differ by their shapes as shown in FIG. 7. In particular according to a preferred construction method, two types of particle shapes are provided in which some are more elongated than others.

The magnetization of particles that are the least spherical tends to be fixed. The shape factor of particles affects their response in a field in the sense that the relaxation time is exponentially dependent on their anisotropic constant.

FIG. 7 shows a deposition under magnetic field example in which non-spherical particles have one of their main elongation axis parallel to a defined direction. This can be used to find a relative resistivity modulation equal to Δ and not Δ/2, and a resistance that is an uneven function of the applied field.

In the above, the distribution of the various particles was not specified and it may be assumed that this arrangement is random.

However according to the invention, particles in layer 1 may be arranged in accordance with a determined distribution. In particular in FIG. 8, alternate layers of different types of particles are provided.

For example, by providing particles 20 with fixed magnetization insensitive to the field to be detected and particles 21 with a magnetization sensitive to the field to is be detected, different layers are available some of which contain particles 20 and others contain particles 21. If sufficiently thin layers are made, a device may be obtained in which each particle 21 only has particles 20 as its immediate neighbors, and vice versa, along the direction perpendicular to the plane of layers. In this way tunnel junctions between the same type of particles do not percolate through the material.

The magnetoresistive transducer according to the invention has the following advantages resulting from the design of the particular material layer.

Resistivity of the layer 1 is:

$$\rho = \left\langle \left[ \frac{G_o}{d} e^{-\frac{\langle d \rangle}{\lambda}} \right]^{-1} \right\rangle \quad (4)$$

The resistivity of layer 1 is variable since the average spacing <d> between particles can be modified during deposition, for example by choosing the fraction of metal by volume, such that values of the order of 100 $\Omega.cm^{13}$ can be obtained enabling use in perpendicular transport and making coil type geometries unnecessary in parallel transpod.

The layer 1 provides an ahysteretic magnetic behavior without Barkausen type noise for variable fields with a frequency less than:

$$V_{max} = \frac{1}{\tau} = \frac{1}{\tau_0} \theta^{-\frac{\epsilon_0}{kT}} \quad (5)$$

This frequency may be of the order of 100 MHz for particles with a diameter of about ten nanometers if materials with very low anisotropy are chosen, such as the (Fe, Ni) alloy with a composition similar to $Ni_{80}Fe_{20}$. Use can therefore be considered in detectors with necessarily short response times such as read heads in high throughput recording systems.

The layer 1 provides a magnetic permeability, the typical value of which should be in the region of 400 knowing that an assembly of 10 nm diameter particles of $Ni_{80}Fe_{20}$ should saturate at about 10 Oe (in accordance with Langevin's law) with saturation magnetization of 10,000 G and a fraction by volume of 40% for the magnetic material, appears quite compatible with conduction dominated by the tunnel effect between isolated particles. This should enable efficient coupling between the transducer and a magnetic circuit such as that in a read head for magnetic recording.

The layer 1 provides magnetoresistance in low fields, since in zero field the distribution of relative magnetization orientations between adjacent particles is homogeneous, whereas under saturation conditions (in other words for an applied field greater than or equal to the 10 Oe mentioned above), all magnetizations are aligned with the external field and are therefore parallel to each other. Theoretical modeling demonstrates that under these conditions a relative resistivity modulation equal to Δ/2 is obtained and that the maximum order of magnitude of resistance modulation is 7% in known material systems, but much higher values cannot be excluded due to its high sensitivity to details of the electronic structure of the junction.

The layer 1 provides magnetoresistance and resistivity that are practically independent of temperature. The Coulomb blocking phenomenon becomes negligible for particles with a diameter of about 100 nm, and the tunnel effect is practically independent of the temperature.

The magnetic metallic multilayers of the invention provide a magnetoresistance independent of the orientation of the current relative to magnetization.

A device such as that shown in FIG. 1 can be made by sputtering such that a substrate that is fixed to a rotating support passes successively between several sources. For example one source containing one of the magnetic materials and the insulation, and a second source containing the second magnetic material and the same insulation. Or two targets containing the same materials but at different concentrations in order to obtain different grain sizes.

Figure 9:
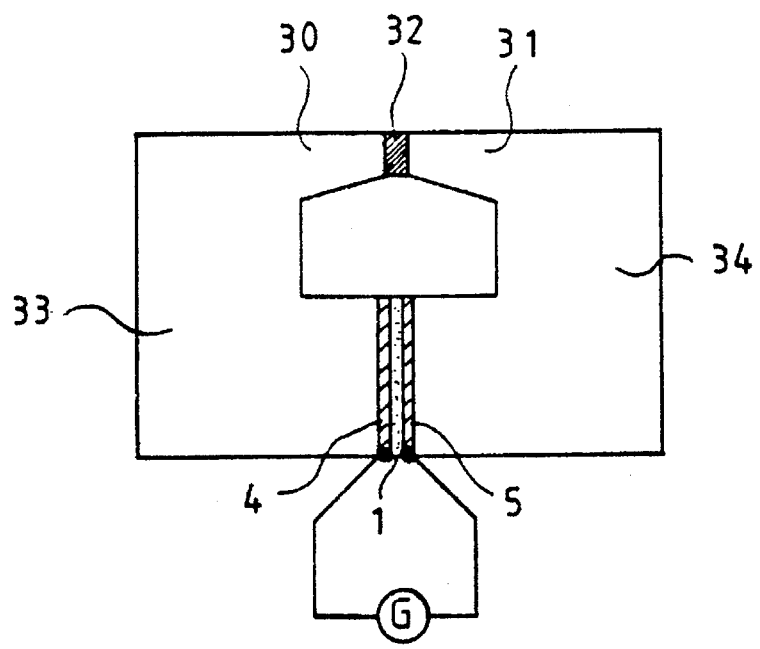

FIG. 9 shows an application of the magnetoresistive transducer according to the invention for the manufacture of a magnetic read head.

This read head has two magnetic poles 30, 31 separated by an air gap 32. Poles 30, 31 are connected by a magnetic circuit 33, 34 into which a transducer according to the invention is inserted in series. Therefore this transducer contains a layer of composite material squeezed between two electrodes 4 and 5.

When a recording support carrying magnetic information passes in front of the air gap 32, it induces a magnetic field that is closed in magnetic circuit 33, 34. Transducer 1, 4, 5 is therefore subjected to this field and a resistance measurement instrument G measures a change in the resistance.

Figure 10:
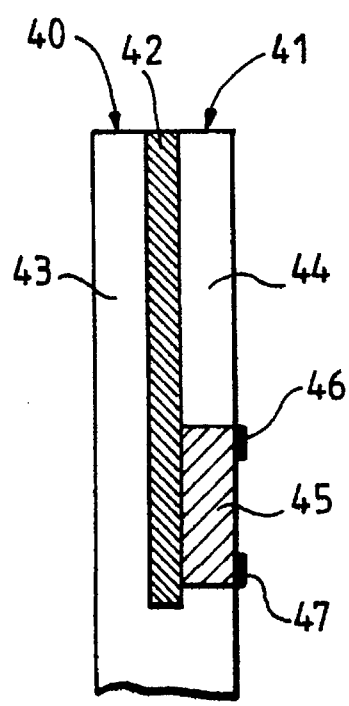
FIG. 10 is a magnetic head according to the invention.

FIG. 10 shows an example of construction of a magnetic head in thin layers containing two layers 43, 44 of a magnetic material separated by a layer 42 made of non-magnetic material. Ends 40, 41 of layers 43, 44 form the magnetic poles of the head and are separated by an air gap layer 42. For example one of the layers 44 is interrupted and in the interruption, contains layer 45 according to the invention. Layer 45 is equipped with electrodes 46, 47 used to measure the resistivity of this layer.

Figure 11:
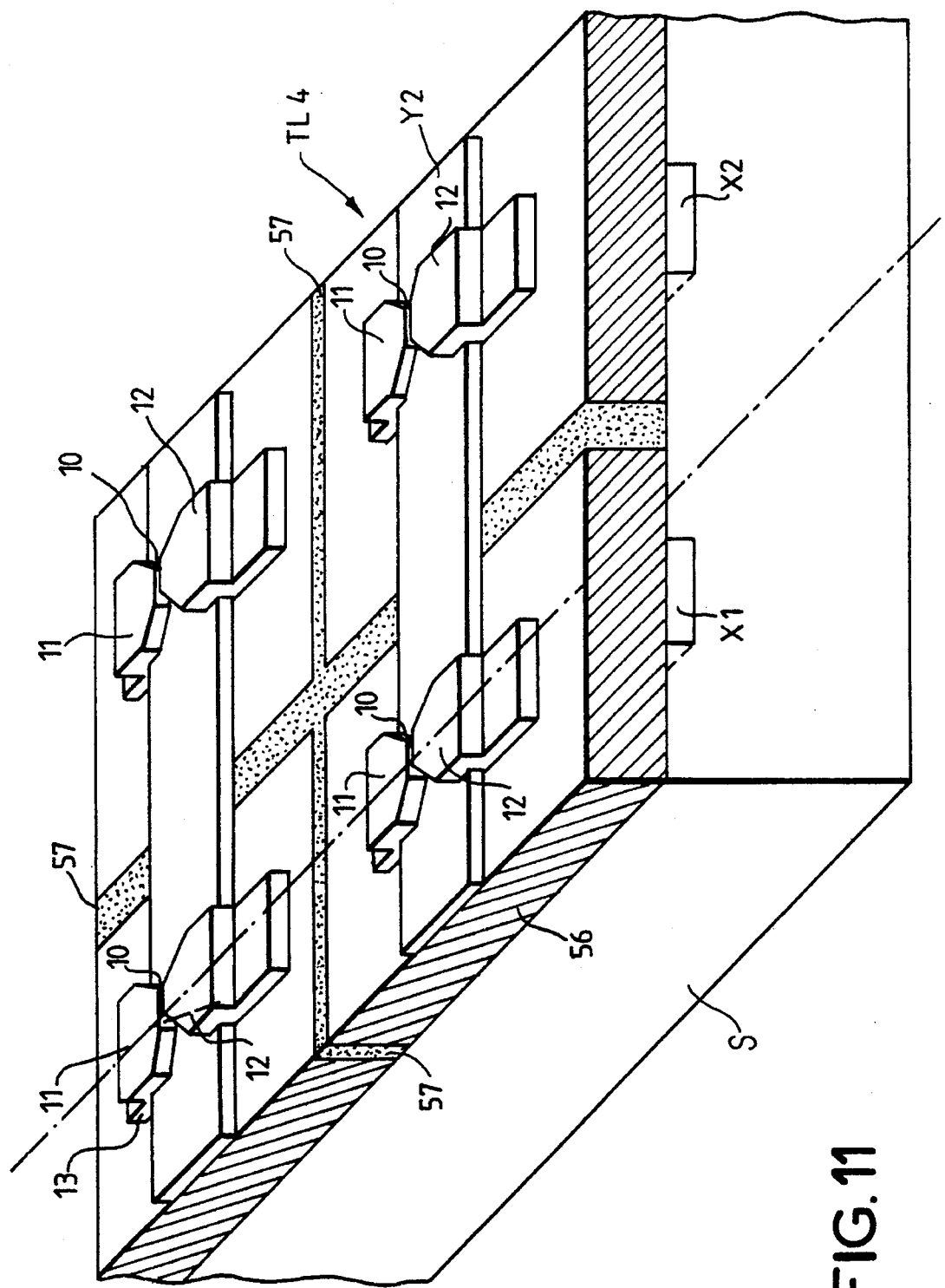
FIG. 11 is a magnetic head according to the invention.

FIG. 11 shows a planar magnetic head on a substrate 5 containing a matrix arrangement of elementary magnetic heads.

Each elementary magnetic head contains two magnetic poles 11, 12 separated by an air gap 10. The assembly is supported by at least one layer 5b made of a material according to the invention, in other words containing particles made of magnetic material cast into a non-magnetic material. Electrodes X1 and Y2 placed on each side of layer 56 are used to measure its resistivity. In the matrix arrangement shown in FIG. 11, an electrode Y2 is placed between layer 56 and the poles in a row on the other side of layer 56, under a column of poles orthogonally to electrode Y2.

In the above it is considered that particles sensitive to the magnetic field to be detected are superparamagnetic, but it may also be considered that they have a very low coercive field.

In this case the disorder in the orientation of magnetization in low fields is no longer due to thermal fluctuations, but to the isotropic distribution of "easy" axes of the said soft particles.

For example, particles of magnetic material may be particles of Ni, Co, Fe, alloys such as $Ni_{1-x}Fe$, $Ni_{1-x-y}Fe_xCo_y$, or. "hard" magnetic materials. The matrix, in other words the material surrounding these particles, may be made of $SiO_2$, $Al_2O_3$, C, Si, Ge, AsGa, etc.

We claim:

1. A magnetoresistive transducer, comprising:

a layer of composite material containing a plurality of particles of conducting magnetic material that are distributed in an insulating or semiconducting material;

first and second electrodes contacting the layer of composite material; and means for applying a bias magnetic field which biases the resistivity of the layer of composite material to a magnetic field level at which change in resistivity of the layer of composite material as a function of magnetic field level is linear;

wherein the plurality of particles of conducting magnetic material comprise a first set of particles that are formed from magnetically hard material, each of the particles of the first set having a magnetization which is insensitive to external magnetic fields, and a second set of particles, each of the particles of the second set having a magnetization which is sensitive to external magnetic fields.

2. A transducer according to claim 1, wherein the first set of particles are distributed in parallel layers, the second set of particles are distributed in parallel layers that are distinct from the parallel layers formed by the first set of particles, and the parallel layers of the first set are parallel to and alternate with the parallel layers of the second set.

3. A transducer according to claim 2, wherein the first and second electrodes form layers and the layers of the first and second electrodes are parallel to the layers formed by the first and second sets of particles.

4. A transducer according to claim 1, wherein all the particles of the first set have a magnetization vector pointing along the same direction.

5. A transducer according to claim 1, wherein particles of the first set are larger than particles of the second set.

6. A transducer according to claim 5, wherein particles of the first set are non-spherical.

7. A transducer according to claim 6, wherein particles of the second set are spherical.

* * * * *